(12) United States Patent
Kalchuri et al.

(10) Patent No.: US 10,032,692 B2
(45) Date of Patent: Jul. 24, 2018

(54) SEMICONDUCTOR PACKAGE STRUCTURE

(71) Applicant: NVIDIA Corporation, Santa Clara, CA (US)

(72) Inventors: Shantanu Kalchuri, San Jose, CA (US); Brian Schieck, Hayward, CA (US); Abraham Yee, Cupertino, CA (US)

(73) Assignee: Nvidia Corporation, Santa Clara, CA (US)

( * ) Notice: Subject to any disclaimer, the term of this patent is extended or adjusted under 35 U.S.C. 154(b) by 0 days.

(21) Appl. No.: 13/797,637

(22) Filed: Mar. 12, 2013

(65) Prior Publication Data

US 2014/0264816 A1    Sep. 18, 2014

(51) Int. Cl.
| | |
|---|---|
| H01L 23/10 | (2006.01) |
| H01L 23/34 | (2006.01) |
| H01L 23/433 | (2006.01) |
| H01L 25/16 | (2006.01) |
| H01L 23/367 | (2006.01) |
| H01L 23/42 | (2006.01) |
| H01L 23/498 | (2006.01) |
| H01L 23/31 | (2006.01) |

(52) U.S. Cl.
CPC .......... H01L 23/4334 (2013.01); H01L 25/16 (2013.01); *H01L 23/3128* (2013.01); *H01L 23/3675* (2013.01); *H01L 23/42* (2013.01); *H01L 23/49816* (2013.01); *H01L 23/49822* (2013.01); *H01L 23/49827* (2013.01); *H01L 2224/16225* (2013.01); *H01L 2224/32225* (2013.01); *H01L 2224/32245* (2013.01); *H01L 2224/73204* (2013.01); *H01L 2224/73253* (2013.01); *H01L 2224/92225* (2013.01); *H01L 2924/15311* (2013.01); *H01L 2924/1659* (2013.01); *H01L 2924/16251* (2013.01); *H01L 2924/18161* (2013.01); *H01L 2924/19041* (2013.01); *H01L 2924/19105* (2013.01)

(58) Field of Classification Search
CPC ................ H01L 23/10; H01L 23/24; H01L 2224/32245; H01L 2224/73253; H01L 2924/16151; H01L 2924/16195; H01L 2924/01019; H01L 2924/16152; H01L 25/072; H01L 25/071; H01L 25/115; H01L 25/0655
USPC ....................................... 257/704
See application file for complete search history.

(56) References Cited

U.S. PATENT DOCUMENTS

| | | |
|---|---|---|
| 5,545,850 A | 8/1996 | Mahulikar |
| 5,841,194 A | 11/1998 | Tsukamoto |

(Continued)

*Primary Examiner* — Joseph C Nicely
*Assistant Examiner* — Wilner Jean Baptiste

(57) ABSTRACT

Various embodiments relating to semiconductor package structures having reduced thickness while maintaining rigidity are provided. In one embodiment, a semiconductor package structure includes a substrate including a surface, a semiconductor die including a first interface surface connected to the surface of the substrate and a second interface surface opposing the first interface surface, a mold compound applied to the substrate surrounding the semiconductor die. The second interface surface of the semiconductor die is exposed from the mold compound. The semiconductor package structure includes a heat dissipation cover attached to the second interface surface of the semiconductor die and the mold compound.

12 Claims, 4 Drawing Sheets

(56) References Cited

U.S. PATENT DOCUMENTS

| | | | |
|---|---|---|---|
| 6,936,499 B2 | 8/2005 | Shibata | |
| 7,211,889 B2 | 5/2007 | Shim | |
| 7,250,676 B2 * | 7/2007 | Wang | H01L 25/105 257/723 |
| 7,352,071 B2 | 4/2008 | Yee | |
| 7,781,682 B2 * | 8/2010 | Bahadur | H01L 21/56 174/521 |
| 2002/0060084 A1 | 5/2002 | Hilton | |
| 2004/0090756 A1 * | 5/2004 | Ho | H01L 21/6835 361/767 |
| 2004/0212970 A1 * | 10/2004 | Chen et al. | 361/764 |
| 2005/0224953 A1 * | 10/2005 | Lee et al. | 257/704 |
| 2008/0284047 A1 | 11/2008 | Tosaya | |
| 2009/0116205 A1 * | 5/2009 | Yamaguchi | B23K 35/264 361/783 |
| 2010/0001410 A1 * | 1/2010 | Kang | H01L 21/565 257/778 |
| 2011/0147919 A1 * | 6/2011 | Sutardja | H01L 23/13 257/706 |
| 2012/0187583 A1 | 7/2012 | Karpur | |
| 2013/0270721 A1 * | 10/2013 | Chiriac et al. | 257/796 |

* cited by examiner

SEMICONDUCTOR PACKAGE STRUCTURE

BACKGROUND

Semiconductor packages having small form factors allow for overall smaller and thinner device size, which generally is desirable in computing devices and particularly so in mobile devices such as smartphones, tablet computers, and the like. Semiconductor package size and form factors often are dictated by rigidity requirements. In particular, package thickness may need to be increased in order to have the device fall within acceptable curvature or warpage thresholds. Curvature and warpage may occur due to temperature cycling (e.g., repeated heating and cooling) throughout manufacture and operation of the semiconductor package. This deformation can cause the semiconductor device to degrade and malfunction, and rigidity concerns therefore play an important role in the design and manufacture of semiconductor packages.

DETAILED DESCRIPTION

The present description relates to semiconductor package structures and methods for manufacturing semiconductor package structures. More particularly, the present description relates to semiconductor package structures that allow for reduced size and thickness while maintaining rigidity. While providing desired rigidity, the semiconductor package structures allow ample surface area to accommodate relatively large semiconductor dies and/or other components. The example structures herein may be used advantageously in a variety of settings, but may be particularly useful in mobile computing devices, such as smartphones, tablet computers, etc., where thin, small and lightweight form factors are desirable.

Figure 1:
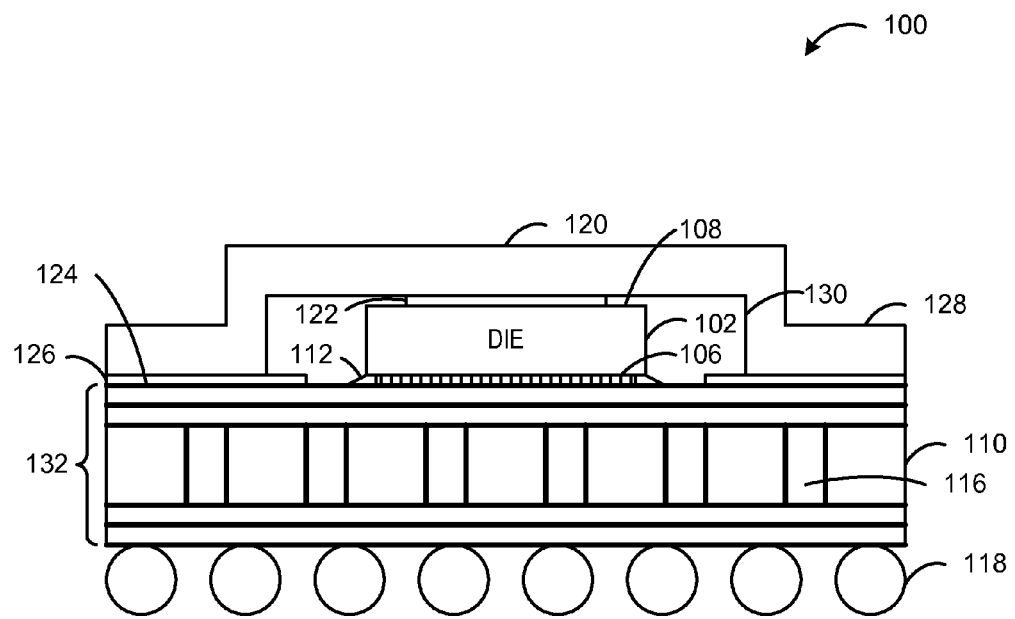
FIG. 1 shows a semiconductor package structure according to an embodiment of the present disclosure.

FIG. 1 shows a semiconductor package structure 100 (referred to herein as "package structure") according to an embodiment of the present disclosure. Package structure 100 may include one or more semiconductor devices, such as a semiconductor die 102 (e.g., a microprocessor). The semiconductor die may include a first interface surface 106 and a second, opposing interface surface 108. The first interface surface of the semiconductor die may be connected to a substrate 110 via an underfill material 112. The underfill material may include an adhesive or other liquid that is applied to the substrate and hardens to protect connectivity between the semiconductor die and the substrate. The present disclosure contemplates any suitable method/structure for structurally connecting a semiconductor die to a substrate.

The substrate 110 mechanically supports and is configured to enable electrical connection of the semiconductor die to other devices. In the present example, conductivity is provided through vias 116 in the substrate to package balls 118. The package balls may be arranged in a ball grid array (BGA) to allow for high density I/O connections with external components in the computing system. This is but one non-limiting example—a variety of other methods may be used to provide external electrical connection between the die and other components.

The package structure 100 may include a heat dissipation cover 120 attached to interface surface 108 of the semiconductor die via a thermal interface material 122. The heat dissipation cover cools the semiconductor die by dissipating heat from the semiconductor die into the ambient surrounding area. Typically, the heat dissipation cover contacts substantially an entirety of interface surface 108 to maximize heat dissipation.

In the example of FIG. 1, the heat dissipation cover is also attached to a surface 124 of the substrate, e.g., via attachment material 126, to enclose the semiconductor die and add rigidity to the package structure. In particular, the heat dissipation cover is attached around a perimeter of the substrate so as to surround the semiconductor die on all four sides.

In the illustrated embodiment, the heat dissipation cover includes an outwardly-extending stiffener ring 128 that increases the attachment surface area between the heat dissipation cover and the surface of the substrate to increase overall rigidity of the package structure. In one example, the stiffener ring occupies approximately 1.5 millimeters of space on all four sides of the semiconductor die. The use of the term "ring" does not imply a particular shape (e.g., round) but is instead used to connote a structure that connects to the substrate so as to surround the enclosed semiconductor device.

In order to provide rigidity, heat dissipation, and to accommodate the thickness of the semiconductor die, the heat dissipation cover is shaped to include walls 130 that extend from an interior edge of the stiffener ring upward away from the surface of the substrate. The walls extend in this manner so that the bottom surface of the central portion of the heat dissipation cover is high enough to accommodate the semiconductor die and contact its second interface surface to dissipate heat as described above. In other words, the heat dissipation cover has a non-flat shape to allow it to contact both the substrate and the heat transfer surface of the semiconductor die.

As indicated in the figure, substrate has a thickness 132. The needed thickness is a function of the collective rigidity characteristics of the substrate in combination with the heat dissipation cover, and particularly the stiffening ring 128. Specifically, the substrate thickness is selected so as to maintain overall rigidity and so that the semiconductor package stays within acceptable curvature or warpage thresholds. Staying within these thresholds reduces degradation and potential malfunctioning of the enclosed semiconductor die.

In some embodiments, the stiffener ring may be omitted from the heat dissipation cover. Instead, the downwardly-extending walls 130 of the heat dissipation cover may attach to the perimeter of the substrate without having the stiffening ring portion that extends outward parallel to the substrate. While this configuration can allow for more room within the package structure, it typically will be less rigid, such that the deficit in rigidity would have to be compensated for by increasing the thickness of the substrate. The stiffening ring, on the other hand, provides increased rigidity, potentially allowing for a thinner substrate, but at the expense of space inside the package structure since it occupies a significant amount of surface area on the substrate around the semiconductor die.

Although the stiffener ring provides some rigidity benefit, its shape can make it less rigid than other potential structures. As shown in FIG. 1, the heat dissipation cover attaches at the perimeter of the substrate leaving some space between walls 130 and the semiconductor device. This is relatively less rigid than a configuration in which a heat dissipation cover has a substantially flat connection to a corresponding surface similar in dimension (length, width, area, etc.) to the substrate.

Figure 2:
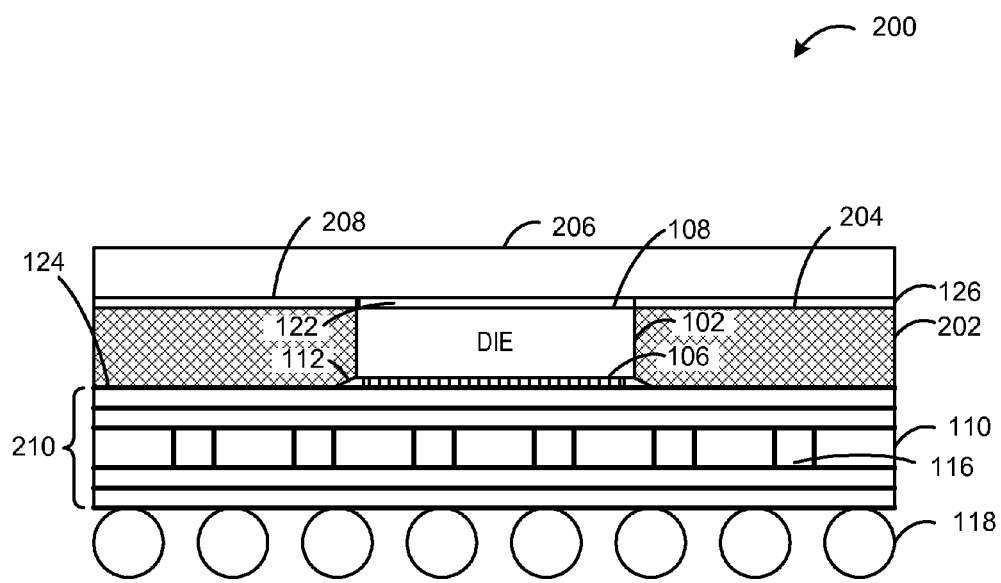
FIG. 2 shows an embodiment of a semiconductor package structure configured to enable reduced thickness relative to the semiconductor package structure of FIG. 1.

FIG. 2 shows a semiconductor package structure 200 that can provide for a reduced thickness relative to the configuration of FIG. 1 while maintaining rigidity and allowing increased space inside the package structure for a relatively larger die and/or inclusion of other components. Semiconductor package 200 is similar in some respects to and repeats reference numbers from the example of FIG. 1. Common features in general will be described with minimal repetition. It will be appreciated, however, that components identified in the same general way in different embodiments of the present disclosure may be at least partly different depending on the particular implementation/setting.

Semiconductor package structure 200 includes a mold compound 202 applied to the surface 124 of the substrate 110 surrounding the semiconductor die 102. Organic epoxy material is one example of a suitable material that may be employed. In some cases, it will be desirable that the mold compound have a coefficient of thermal expansion that substantially matches other components of the semiconductor package structure in order to meet desired curvature or warpage characteristics.

The mold compound may be applied in liquid form to the substrate after the semiconductor die and other components are positioned on the substrate, thereby allowing as much area on the substrate to be used as possible for the semiconductor die and other components. The mold compound may be applied to cover substantially the entire surface of the substrate that is exposed surrounding the semiconductor die. As indicated, the mold compound may fill the entire area around the semiconductor die and up flush with the interface surface 108 of the semiconductor die, while still leaving surface 108 exposed (i.e., not covered by the mold compound). Accordingly, the second interface surface of the semiconductor die (surface 108) and a top or upward facing surface 204 of the mold compound may be substantially planar. The second interface surface of the semiconductor die and the surface of the mold compound thus collectively provide a flat, continuous surface to accommodate a heat dissipation cover 206.

The heat dissipation cover 206 may be attached to the second interface surface of the semiconductor die via a thermally-conductive interface material 122. Furthermore, the heat dissipation cover may be attached to the surface 204 of the mold compound via a suitable attachment material 126. The heat dissipation cover may be substantially flat or sheet-like. In particular, a surface 208 of the heat dissipation cover that attaches to the semiconductor die and the mold compound may be substantially flat to attach with substantially an entirety of the second interface surface of the semiconductor die and the surface of the mold compound. Since the surface of the heat dissipation cover that attaches to the semiconductor die and the mold compound is flat, the heat dissipation cover does not extend perpendicularly beyond the second interface surface of the semiconductor die towards the substrate. Likewise, since the mold compound fills in the space on the surface of the substrate that surrounds the semiconductor die, the heat dissipation cover is not itself attached to the surface of the substrate. Instead, the heat dissipation cover is spaced apart from the surface of the substrate.

The layer of the mold compound and the semiconductor die in combination with the flat heat dissipation cover may provide a level of rigidity greater than that provided by the heat dissipation cover and stiffener ring shown in FIG. 1. In particular, the continuous contact across substantially the entirety of the surface 208 of the heat dissipation cover and the second interface surface 108 of the semiconductor die as well as the surface 204 of the mold compound provide an increase in rigidity relative to the perimeter contact of the stiffener ring of FIG. 1. Accordingly, the surface of the substrate does not attach to a stiffener ring for added rigidity and the stiffener ring may be omitted from the semiconductor package structure 200.

Furthermore, the increased rigidity of the continuous layer of the mold compound and the semiconductor die in combination with the flat heat dissipation cover allow for a thickness 210 of the substrate to be reduced while still remaining within acceptable curvature/warpage thresholds for the semiconductor package structure. In particular, the thickness 210 of the substrate shown in FIG. 2 may be less than the thickness 132 of the substrate shown in FIG. 1. As such, the overall height of the semiconductor package 200 can be less than that of semiconductor package 100. Moreover, the flat design of the heat dissipation cover may reduce complexity and manufacturing costs relative to the heat dissipation cover shown in FIG. 1.

Figure 3:
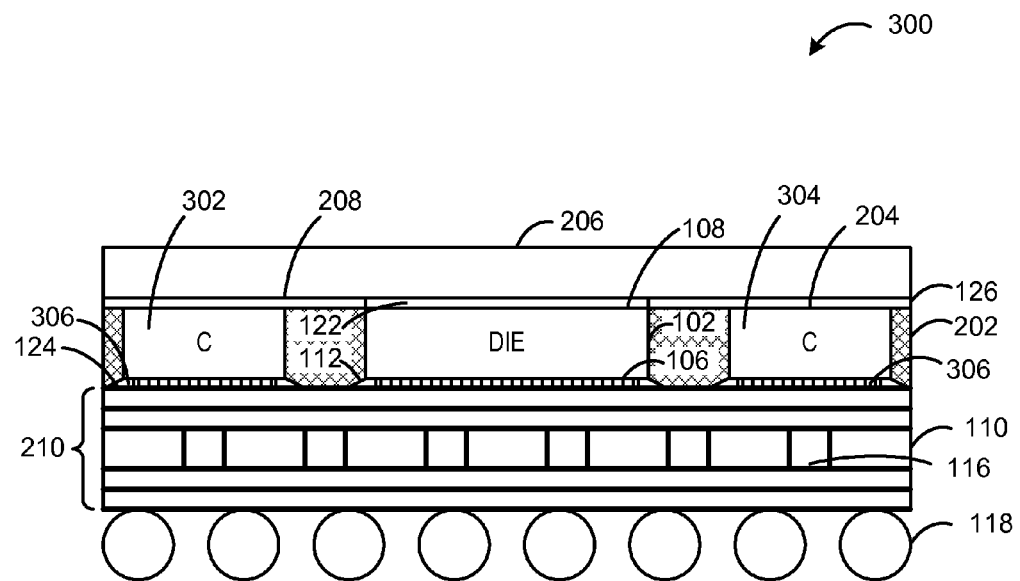
FIG. 3 shows another embodiment of a semiconductor package structure configured to provide reduced thickness relative to the semiconductor package structure of FIG. 1.

FIG. 3 depicts another embodiment of a semiconductor package structure 300 that can provide reduced thickness while maintaining rigidity and without unduly reducing space inside the package for the semiconductor die and other components. Semiconductor package structure 300 is similar in some respects to and repeats reference numbers from the example of FIG. 1. Common features in general will be described with minimal repetition. It will be appreciated, however, that components identified in the same general way in different embodiments of the present disclosure may be at least partly different depending on the particular implementation/setting.

Similar to semiconductor package structure 200, package structure 300 omits the heat dissipation cover that includes the stiffener ring in favor of a mold compound and flat heat dissipation cover. Additional surface area on the substrate that surrounds the semiconductor die is therefore likewise available for additional components to be provided within the semiconductor package structure. In the depicted example, capacitors are provided within the semiconductor package structure. Specifically, capacitor 302 may be connected to the surface 124 of the substrate 110 via underfill material 306 and capacitor 304 may be connected to the surface 124 of the substrate 110 via underfill material 308. The underfill material may include an adhesive or other liquid that is applied to the substrate and hardens to protect connectivity between the capacitors and the substrate. The capacitors may be positioned on the substrate prior to application of the mold compound.

Once the capacitors are positioned to the substrate, the mold compound may be applied in liquid form to substantially an entirety of the surface of the substrate that is exposed surrounding the semiconductor die and capacitors. The mold compound may contact the substrate all the way up to edges of the semiconductor die and capacitors, thereby forming a continuous mass of material on the substrate.

Also, the mold compound may be filled into these areas up to a level so that the upper surface of the mold compound is flush with the upward-facing surfaces of the capacitors and the semiconductor die. The second interface surface of the semiconductor die, the upward facing surfaces of the capacitors, and the upward facing surface of the mold compound may therefore be substantially planar. In other words, the second interface surface of the semiconductor die, the upward facing surfaces of the capacitors, and the upward facing surface of the mold compound collectively provide a flat, continuous surface to promote a rigidity-enhancing interface with the heat dissipation cover. The semiconductor die surface and the surfaces of the capacitors may be left exposed (i.e., not covered by the mold compound) in order to have contact with the heat dissipation cover to facilitate heat transfer.

The capacitors may provide power to the semiconductor die during power up or power down conditions as well as during noise spikes. This power stabilization can help to prevent the semiconductor die from dropping below a retention voltage and otherwise aid performance. By connecting the capacitors to the available space surrounding the semiconductor die and then filling in with the mold compound, the capacitors do not need to be positioned on another discrete component external to the semiconductor package structure, which again may provide a desirable reduction in size. Although the illustrated embodiment includes capacitors, it will be appreciated that any suitable type and number of electronic components may be connected to the substrate surrounding the semiconductor die of the semiconductor package structure 300 without departing from the scope of the present disclosure.

Figure 4:
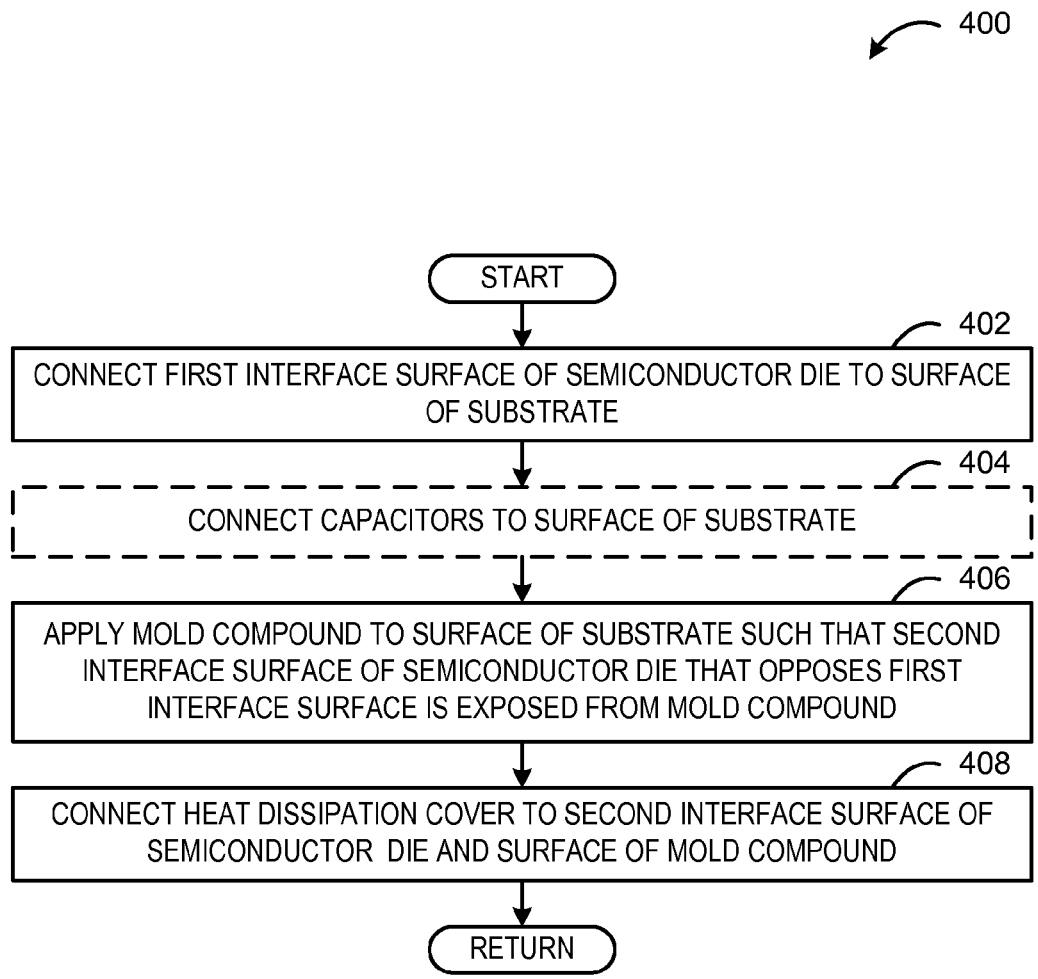
FIG. 4 shows a method for manufacturing a semiconductor package structure according to an embodiment of the present disclosure.

FIG. 4 shows a method 400 for manufacturing a semiconductor package structure according to an embodiment of the present disclosure. Method 400 may be performed to manufacture the semiconductor package structures of FIGS. 2 and 3, or semiconductor packages having different configurations.

At 402, method 400 may include connecting a first interface surface of a semiconductor die to a surface of a substrate. For example, the semiconductor die may be connected to the substrate via an underfill material that hardens to protect the electrical connectivity between the semiconductor die and the substrate.

In some embodiments, at 404, method 400 may include connecting one or more capacitors to the surface of the substrate. For example, capacitors may be connected to the substrate via an underfill material that hardens to protect the electrical connectivity between the capacitors and the substrate. The one or more capacitors may be connected to the surface of the substrate prior to applying a mold compound. In some embodiments, the method may include connecting other electrical components to the substrate.

At 406, the method 400 may include applying a mold compound to the surface of the substrate such that a second interface surface of the semiconductor die that opposes the first interface surface is exposed and remains uncovered by the mold compound. The mold compound may be applied to substantially an entirety of the surface of the substrate that is exposed surrounding the semiconductor die and such that the second interface surface of the semiconductor die and a surface of the mold compound are substantially planar. When included, the capacitors may be exposed from the mold compound as well, and the semiconductor die, the capacitors, and the mold compound may provide a flat surface to accommodate a heat dissipation cover.

At 408, the method 400 may include attaching a heat dissipation cover to the second interface surface of the semiconductor die and a surface of the mold compound. For example, the heat dissipation cover may be attached to the second interface surface of the semiconductor die via a thermal interface material. Furthermore, the heat dissipation cover may be attached to the surface of the mold compound via an attachment material. The surface of the heat dissipation cover that attaches to the second interface surface of the semiconductor die and the surface the mold compound may be substantially flat such that the heat dissipation cover does not extend perpendicularly beyond the second interface surface of the semiconductor die towards the substrate. Furthermore, since the semiconductor die and the mold compound form a layer on the surface of the substrate, the heat dissipation cover may be spaced from the surface of the substrate and may not attach to the substrate.

By applying a mold compound so as to surround the semiconductor die, a rigid layer may be formed that allows for a stiffener ring to be omitted from the heat dissipation cover and a thickness of the substrate to be reduced while maintaining desired rigidity characteristics. In this way, the overall thickness of the semiconductor package structure may be reduced. By eliminating the stiffener ring and not attaching the heat dissipation cover to the substrate, surface area on the substrate may be made available for a relatively larger semiconductor die or other electrical components.

This written description uses examples to disclose the invention, including the best mode, and also to enable a person of ordinary skill in the relevant art to practice the invention, including making and using any devices or systems and performing any incorporated methods. The patentable scope of the invention is defined by the claims, and may include other examples as understood by those of ordinary skill in the art. Such other examples are intended to be within the scope of the claims.

The invention claimed is:

1. A semiconductor package structure comprising:
   a substrate comprising a surface;
   a semiconductor die comprising a first surface connected to the surface of the substrate and a second surface that is not connected to the surface of the substrate;
   a mold compound on the substrate and surrounding the semiconductor die,
   at least one capacitor connected to the surface of the substrate, wherein the mold compound surrounds the at least one capacitor;
   wherein the second surface of the semiconductor die is exposed from the mold compound;
   wherein a surface of the at least one capacitor is exposed from the mold compound;
   wherein the second surface of the semiconductor die, the exposed surface of the at least one capacitor, and a surface of the mold compound are substantially planar; and
   a heat dissipation cover attached to the second surface of the semiconductor die and the mold compound.

2. The semiconductor package structure of claim 1, wherein the mold compound is on substantially an entirety of the surface of the substrate that is exposed from the semiconductor die and the at least one capacitor.

3. The semiconductor package structure of claim 1, wherein a surface of the heat dissipation cover that attaches to the semiconductor die and the mold compound is substantially flat.

4. The semiconductor package structure of claim 1, wherein the heat dissipation cover is spaced apart from the surface of the substrate.

5. The semiconductor package structure of claim 1, wherein the heat dissipation cover does not extend below a plane of the second surface of the semiconductor die towards the substrate.

6. The semiconductor package structure of claim 1, wherein the first surface of the semiconductor die is connected to the substrate via an underfill material.

7. A semiconductor package structure comprising:
a substrate comprising a surface;
a semiconductor die comprising a first surface connected to the surface of the substrate and a second surface that is not connected to the surface of the substrate;
at least one capacitor connected to the surface of the substrate;
a mold compound on the substrate surrounding the semiconductor die, wherein the second surface of the semiconductor die and a surface of the at least one capacitor are exposed from the mold compound;
wherein the second surface of the semiconductor die, exposed surface of the at least one capacitor, and a surface of the mold compound are substantially planar; and
a heat dissipation cover attached to the second surface of the semiconductor die, the exposed surface of the at least one capacitor, and the surface of the mold compound.

8. The semiconductor package structure of claim 7, wherein the mold compound is on substantially an entirety of an exposed surface of the substrate surrounding the semiconductor die and the at least one capacitor.

9. The semiconductor package structure of claim 7, wherein a surface of the heat dissipation cover that attaches to the second surface of the semiconductor die, the exposed surface of the at least one capacitor, and the surface of the mold compound is substantially flat.

10. The semiconductor package structure of claim 7, wherein the heat dissipation cover does not extend perpendicularly beyond the second surface of the semiconductor die towards the substrate.

11. The semiconductor package structure of claim 7, wherein the heat dissipation cover is spaced apart from the surface of the substrate.

12. A packaged semiconductor device comprising:
a substrate comprising a surface;
a semiconductor die comprising a first surface connected to the surface of the substrate and a second surface that is not connected to the surface of the substrate;
at least one capacitor comprising a first surface connected to the surface of the substrate and a second surface that is not connected to the surface of the substrate;
a mold compound comprising a first surface connected to the surface of the substrate and a second surface that is not connected to the surface of the substrate, the mold compound surrounding the semiconductor die and the at least one capacitor;
wherein the second surface of the semiconductor die, second surface of the at least one capacitor, and second surface of the mold compound are substantially planar; and
a heat dissipation cover comprising a continuous flat surface, wherein said continuous flat surface is attached to the second surface of the semiconductor die, to the second surface of the at least one capacitor, and the second surface of the mold compound.

* * * * *